(12) United States Patent
Ikeda

(10) Patent No.: US 7,378,850 B2
(45) Date of Patent: May 27, 2008

(54) NMR PROBE

(75) Inventor: Hiroshi Ikeda, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 11/486,403

(22) Filed: Jul. 13, 2006

(65) Prior Publication Data

US 2007/0013378 A1    Jan. 18, 2007

(30) Foreign Application Priority Data

Jul. 15, 2005    (JP)    ............................. 2005-206345

(51) Int. Cl.
  *G01V 3/00*    (2006.01)
(52) U.S. Cl. ...................... 324/322; 324/318
(58) Field of Classification Search ................ 324/318, 324/322

See application file for complete search history.

(56) References Cited

U.S. PATENT DOCUMENTS 5,424,645 A * 6/1995 Doty .......................... 324/318
5,861,748 A * 1/1999 Schaefer et al. ............ 324/318
6,081,120 A * 6/2000 Shen .......................... 324/318
6,794,874 B2 * 9/2004 Hasegawa ................... 324/322
6,833,704 B1 * 12/2004 Murphy et al. ............. 324/318

FOREIGN PATENT DOCUMENTS

JP    02-45477    3/1990
JP    03-10282    1/1991
JP    03-223686    10/1991

* cited by examiner

*Primary Examiner*—Brij Shrivastav
*Assistant Examiner*—Megann E Vaughn
(74) *Attorney, Agent, or Firm*—The Webb Law Firm

(57) ABSTRACT

An NMR probe which has a multi-element switching mechanism. The NMR probe has a rotary tuner block, a contact unit, a rotationally driving unit for rotating the rotary tuner block. The rotary tuner block has an NMR probe body, a rotary body, and plural pairs of tuning elements disposed on the surface of the rotary body. This rotary body is rotatably held in the NMR probe body and made of a nonmagnetic material. A sample coil is mounted in the NMR probe body. The contact unit selectively brings the pairs of tuning elements into contact with both ends of the sample coil or with lead wires brought out from both ends of the sample coil. The pairs of tuning elements are selectively connected with the sample coil by rotation of the rotary tuner block.

17 Claims, 11 Drawing Sheets

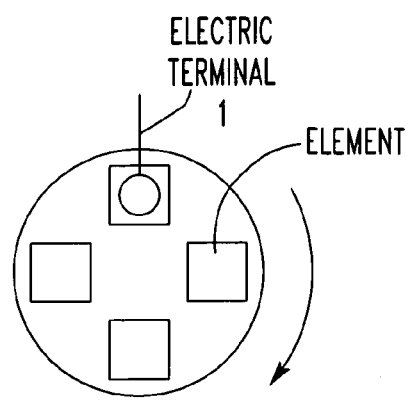
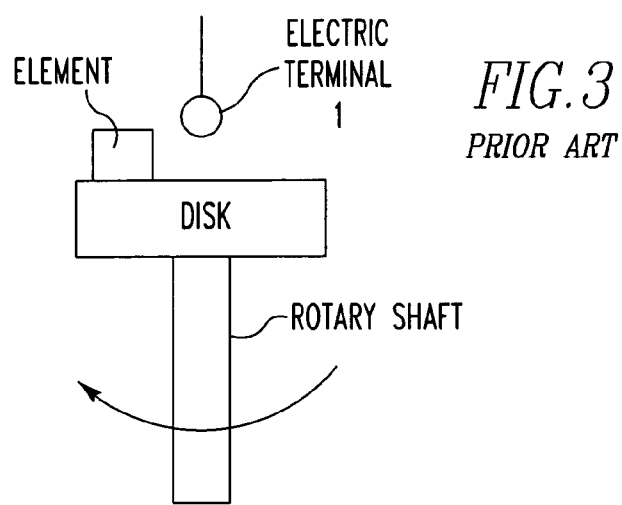
*FIG.3*
*PRIOR ART*
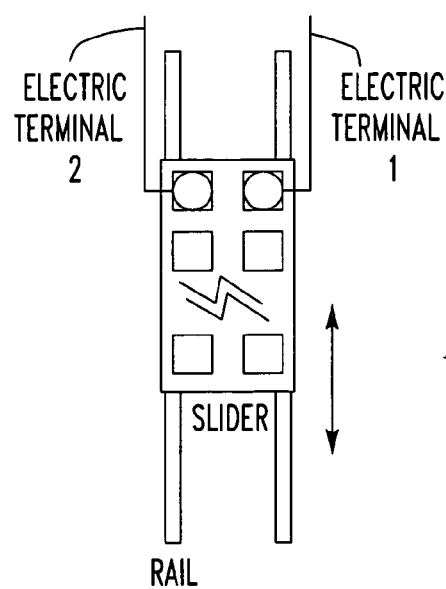
*FIG.4*
*PRIOR ART*

RIGHT SIDE (WITH A CASE)

UPPER SIDE: VIEW FROM SAMPLE COIL

CENTRAL FIGURE: A TYPICAL VIEW UPPER SIDE AS TIP CONDENSERS

EXAMPLES AS CONDUCTORS. COILS ARE WOUND AROUND BOBBINS.

BUSHINGS OR BEARINGS

LOWER SIDE: VIEW FROM PROBE BOTTOM SIDE.

LEFT SIDE (WITH A CASE)

A CASE IS OF A NONMAGNETIC METAL SUCH AS PHOSPHOR BRONZE OR NONMETALLIC BRASS.

COMBINATIONS OF ELEMENTS PLACED ON
BOTH FACES OF THE ROTARY DISK
| FACE 1 | FACE 2 |
|---|---|
| CAPACITOR | CAPACITOR |
| NONE | NONE |
| COIL | COIL |
| CAPACITOR | SHORT |
| COIL | SHORT |
| NONE | CAPACITOR |
| COIL | CAPACITOR |
| NONE | COIL |
*FIG.11*
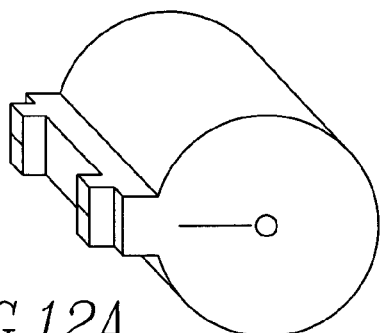
*FIG.12A*
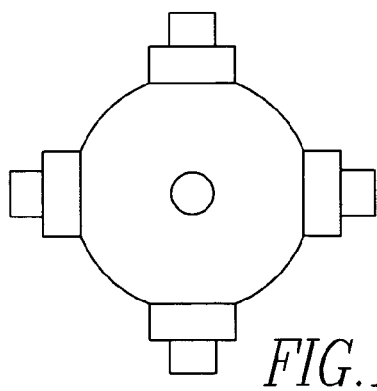
*FIG.12B*

NMR PROBE

BACKGROUND OF THE INVENTION

1. Field of the Invention

The present invention relates to an NMR probe using a variable tuning frequency and, more particularly, to an NMR probe equipped with a built-in disk-like tuner block having tuning elements (such as inductors, capacitors, and other elements forming a resonant circuit) on its both faces.

2. Description of Related Art

FIG. 1 shows main portions of a conventional NMR spectrometer. This NMR spectrometer is used for multiple resonance applications and is generally indicated by reference numeral 200. When a measurement is performed using this NMR instrument 200, a sample tube 1 holding a sample 30 therein is set within a static magnetic field produced by a magnet 2 whose magnetic field distortion has been corrected by a room-temperature shim set 3 that is under control of a magnetic field corrector 6. RF pulses having a frequency corresponding to the intensity of the static field are applied to the sample 30, thus inducing a nuclear magnetic resonance.

In this experiment, the RF pulses are applied to the sample 30 within the sample tube 1 from the multiple-resonance NMR probe 4. In particular, pulsed signals from an oscillator 14 are selected from plural frequency bands (in the illustrated example, there are 3 bands) according to a nuclide within the sample 30 that is to be observed. The signals are amplified by power amplifiers 13, 15, and 16, respectively, which correspond to frequencies $f_1$, $f_2$, and $f_3$, respectively. The outputs from the power amplifiers 13, 15, and 16 are supplied to the multiple-resonance NMR probe 4 via a duplexer 9 that switches the line between input and output. Thus, the RF pulses are applied to the sample 30.

The sample 30 produces an NMR signal having a resonance frequency intrinsic to the nuclide because of an NMR phenomenon. The NMR signal is picked up by the multiple-resonance NMR probe 4.

Where it is necessary to investigate the sample 30 at a given temperature, the temperature of the vicinities of the sample tube 1 within the multiple-resonance NMR probe 4 is controllably varied by a temperature-varying device 5 that is under control of a computer 7.

The NMR signal picked up by the multiple-resonance NMR probe 4 is fed to an amplifier 10 via the duplexer 9 and amplified. The signal is then converted into an audio frequency by a demodulator 11. The audio frequency is converted into a digital signal by an A/D converter (ADC) 12.

The digital signal is accepted into the computer 7 in this way. The computer 7 analyzes the signal and thus analyzes the sample 30. The results of the analysis are displayed on a display device 8. Consequently, the structure of the substance is investigated by the multiple-resonance NMR spectrometer.

FIG. 2A shows an RF resonant circuit incorporated in NMR probes. This prior-art example is an example of an unbalanced resonant circuit. This resonant circuit has a tuning capacitive element C1 for tuning, a variable capacitor that is an auxiliary tuning variable capacitive element for tuning, and a variable capacitor that is a tuning variable capacitive element for matching. To avoid interference between the tuning matching portion and the sample coil portion, the sample coil portion is electromagnetically shielded from the tuning matching portion by a conductive support that is at ground potential. Two lead wires are brought out from the sample coil portion via two small holes formed in the support. One of the lead wires is connected with a conductive frame, which surrounds the NMR probe and is at ground potential. Since this resonant circuit is an unbalanced circuit, the amplitude of the RF magnetic field maximizes at the upper end of the sample coil and decreases down to zero at the lower end of the sample coil.

The prior-art example of FIG. 2B is an example of balanced resonant circuit. The resonant circuit has tuning capacitive elements C1 and C2 for tuning, a variable capacitor that is an auxiliary tuning variable capacitive element for tuning, and a variable capacitor that is a variable capacitive element for matching. To avoid interference between the tuning matching portion and the sample coil portion, the sample coil portion is electromagnetically shielded from the tuning matching portion by a conductive support that is at ground potential. Two lead wires are brought out from the sample coil portion via two small holes formed in the support. One of the lead wires is connected with the tuning matching circuit. The other lead wire is connected with a conductive frame at ground potential, the frame surrounding the NMR probe via the tuning capacitive element C2. Because the resonant circuit is a balanced circuit, the amplitude of the RF magnetic field maximizes at the upper and lower ends of the sample coil and becomes null at the center of the sample coil.

When the tuning range of this RF resonant circuit is extended, the capacitive element C1 or C2 is removed and replaced with another element, such as a capacitive element, having a different capacitance or an inductive element (such as a coil). This replacement is performed by inserting or withdrawing a stick, or a shaft, having an element attached to its front end (see Japanese Utility-Model Laid-Open No. H2-45477 and Japanese Utility-Model Laid-Open No. H3-10282) instead of by soldering.

FIGS. 3 and 4 show devices each of which is equipped with multiple elements to automate the insertion and withdrawal described above. The device of the type shown in FIG. 3 is applied to an unbalanced resonant circuit, such as prior-art as shown in FIG. 2A. This device is used to replace the tuning capacitive element C1 by another element. The replacing element is disposed on a disk mounted on a rotary shaft. The element C1 is replaced by another element by rotating the disk. This shifts the resonance frequency of the unbalanced resonant circuit, such as prior-art shown in FIG. 2A, thus widening the tuning range (Japanese Patent Laid-Open No. H3-223686).

On the other hand, the device of the type shown in FIG. 4 is applied to a balanced resonant circuit, such as prior-art example 2 of FIG. 2B. This device is used to replace the pair of tuning capacitive elements C1 and C2 by other elements. A replacing pair of elements is disposed on a rectangular slider that is mounted on a rail. The pair of the elements C1 and C2 is replaced by another element pair by causing the slider to slide. This shifts the resonance frequency of the balanced resonant circuit, such as prior-art shown in FIG. 2B, extending the tuning range.

These elements are sufficiently spaced from each other to prevent electric discharging between the elements.

One problem with the multi-element switched NMR probe as described above is that it cannot be applied to a balanced resonant circuit because elements are replaced one by one, for example, in the case of the structure of FIG. 3, though the probe can be applied to an unbalanced resonant circuit. Furthermore, the disk plane is perpendicular to the static magnetic field and so eddy currents are produced within the disk plane during rotation. The resulting local magnetic fields adversely affect the NMR lock. Therefore, when the disk is rotating, limitations occur. That is, the loop of the NMR lock cannot be closed. No measurements can be made. The resolution cannot be altered. As a result, improvement of the throughput of high-speed processing tends to be hindered.

On the other hand, in the case of the structure of FIG. 4, parasitic inductance is induced in the longitudinal direction and so, in this system, the resonance frequency of the switching mechanism itself can be increased only up to about 100 MHz. In a high magnetic field NMR spectrometer of the order of hundreds of MHz, the performance suffers from fatal degradation. In high magnetic field NMR spectroscopy, the resonance frequency of $^1H$ nucleus has today reached a value corresponding to 920 MHz. There is a difference of more than 600 MHz when viewed from lower magnetic field NMR spectroscopy corresponding to 300 MHz. Incidentally, the resonance frequency of $^{31}P$ nucleus corresponds to 243 MHz in a 600 MHz NMR spectrometer. Where the slider method is implemented, a limitation has been already reached. This leads to deterioration of the performance.

When the slider method is implemented, elements are made to slide on the rail. Therefore, the resistive component of the conductor corresponding to the contact resistance and the total length of the line is increased extremely. This gives rise to a decrease in the Q value of the circuit. That is, the resistance value is hundreds of m$\Omega$ to orders of $\Omega$. A Q value of the order of hundreds is inevitably produced. Furthermore, parasitic inductance of from more than ten nH to tens of nH is produced. This produces parasitic resonance interfering with the circuitry for nuclides in the HF region (such as $^1H$ and $^{19}F$) that is natural to an NMR detector. Consequently, the performance on the HF side is seriously affected adversely.

More specifically, parasitic inductance of 10 nH and stray capacitance of 4 pF together produce parasitic resonance of about 800 MHz. Parasitic inductance of 10 nH and stray capacitance of 10 pF together produce parasitic resonance of about 500 MHz. Parasitic inductance of 30 nH and stray capacitance of 10 pF together produce parasitic resonance of about 300 MHz. Unwanted signals produced by such parasitic resonances must be eliminated as ghost signals. If such ghost signals increase in number, the operator cannot help neglecting the effects on nuclides other than the main nuclides.

Besides, there are other problems. (i) The slider unavoidably uses a synthetic resin, increasing the background signal. (ii) When each element is made to slide on the rail, electromagnetic noises are produced. (iii) Since the rail is long, wavelength resonance tends to be produced. Incidentally, a quarter wavelength resonance at 800 MHz occurs at about 90 mm. (iv) Electromagnetic radiation from under the NMR detector is promoted.

SUMMARY OF THE INVENTION

In view of the foregoing, it is an object of the present invention to provide an NMR probe equipped with a switching mechanism of the multi-element configuration free from the above-described problems.

An NMR probe which achieves this object in accordance with the teachings of the present invention has a rotary tuner block rotatably held within an NMR probe body, a contact device, and a rotationally driving device for rotating the rotary tuner block. The rotary tuner block has tuning elements arranged in plural pairs on a surface of a rotary body made of a nonmagnetic material. A sample coil is mounted in the NMR probe body. The contact device can selectively bring the pairs of tuning elements into contact with both ends of the sample coil or with lead wires brought out from the both ends of the sample coil. The pairs of tuning elements are selectively connected with the sample coil by rotating the rotary tuner block.

In one feature of the present invention, the rotationally driving device for rotating the rotary tuner block is made of a rotary encoder, thus obtaining high positional reproducibility of the tuning elements.

In another feature of the present invention, the direction of the axis of rotation of the rotary tuner block is substantially perpendicular to the axis of a static magnetic field applied to the NMR probe.

In a further feature of the present invention, the direction of the axis of rotation of the rotary tuner block has a component in the direction of the axis of the static magnetic field applied to the NMR probe.

In yet another feature of the present invention, the surface of the rotary tuner block is provided with grooves extending in a direction crossing the peripheral direction.

In still another feature of the present invention, an NMR lock is held stationary during rotation of the rotary tuner block. Only during this period of time, shim operations are interrupted to permit old shim information to be stored.

In an additional feature of the present invention, the rotary tuner block is accommodated within a shielded conductor case.

In yet a further feature of the present invention, the shielded conductor case is kept at ground potential.

In still a further feature of the present invention, the rotary tuner block is made up of a disk-like body and tuning elements arranged in pairs on both faces of the disk-like body.

In still an additional feature of the present invention, the rotary tuner block is made up of a cylindrical body and tuning elements arranged in pairs on the outer surface of the cylindrical block.

In yet an additional feature of the present invention, the disk forming the rotary tuner block is made either of phosphor bronze plated with gold or of a nonmagnetic metal, such as nonmagnetic brass.

In yet a further feature of the present invention, the disk forming the rotary tuner block has a substrate plated with gold, and the substrate is not plated with a magnetic metal, such as nickel.

In an additional feature of the present invention, the plural pairs of tuning elements are made of combinations of four kinds of elements: (1) capacitive elements, (2) inductive elements (coils), (3) shorting elements, and (4) elements having no terminals (hereinafter may be referred to as "non-terminal elements").

In a further additional feature of the present invention, the combinations of the pairs of tuning elements include any one of (a) capacitive element-capacitive element, (b) non-terminal element-non-terminal element, (c) inductive element-inductive element, (d) capacitive element-shorting element, (e) inductive element-shorting element, (f) non-terminal element-capacitive element, (g) inductive element-capacitive element, and (h) non-terminal element-inductive element.

In yet an additional feature of the present invention, contact terminals of the tuning elements are made of a resilient terminal board made of phosphor bronze or a nonmagnetic metal (such as nonmagnetic brass) and are caused to make contact under pressure.

In still an additional feature of the present invention, the disk forming the rotary tuner block is kept at ground potential by urging the disk into contact with the shielded conductor case with a grounding spring made of phosphor bronze.

An NMR probe of the present invention comprises: a rotary tuner block having an NMR probe body, a rotary body made of a nonmagnetic material and rotatably held in the NMR probe body, and tuning elements arranged in plural pairs on a surface of the rotary body; a sample coil mounted in the NMR probe body; a contact device for selectively bringing the pairs of tuning elements into contact with both ends of the sample coil or with lead wires brought out from both ends of the sample coil; and a rotationally driving device for rotating the rotary tuner block. The pairs of tuning elements are selectively connected with the sample coil by rotation of the rotary tuner block. Consequently, an NMR probe can be offered which has a multi-element switched mechanism free from the drawbacks with the prior art.

Other objects and features of the invention will appear in the course of the description thereof, which follows.

BRIEF DESCRIPTION OF THE DRAWINGS

FIG. 3 shows a prior-art rotating element unit;

FIG. 4 shows another prior-art sliding element unit;

FIG. 11 is a table illustrating combinations of elements in accordance with the present invention;

FIGS. 12A and 12B show another element-switching box according to the present invention;

DESCRIPTION OF THE PREFERRED EMBODIMENTS

Figure 1:
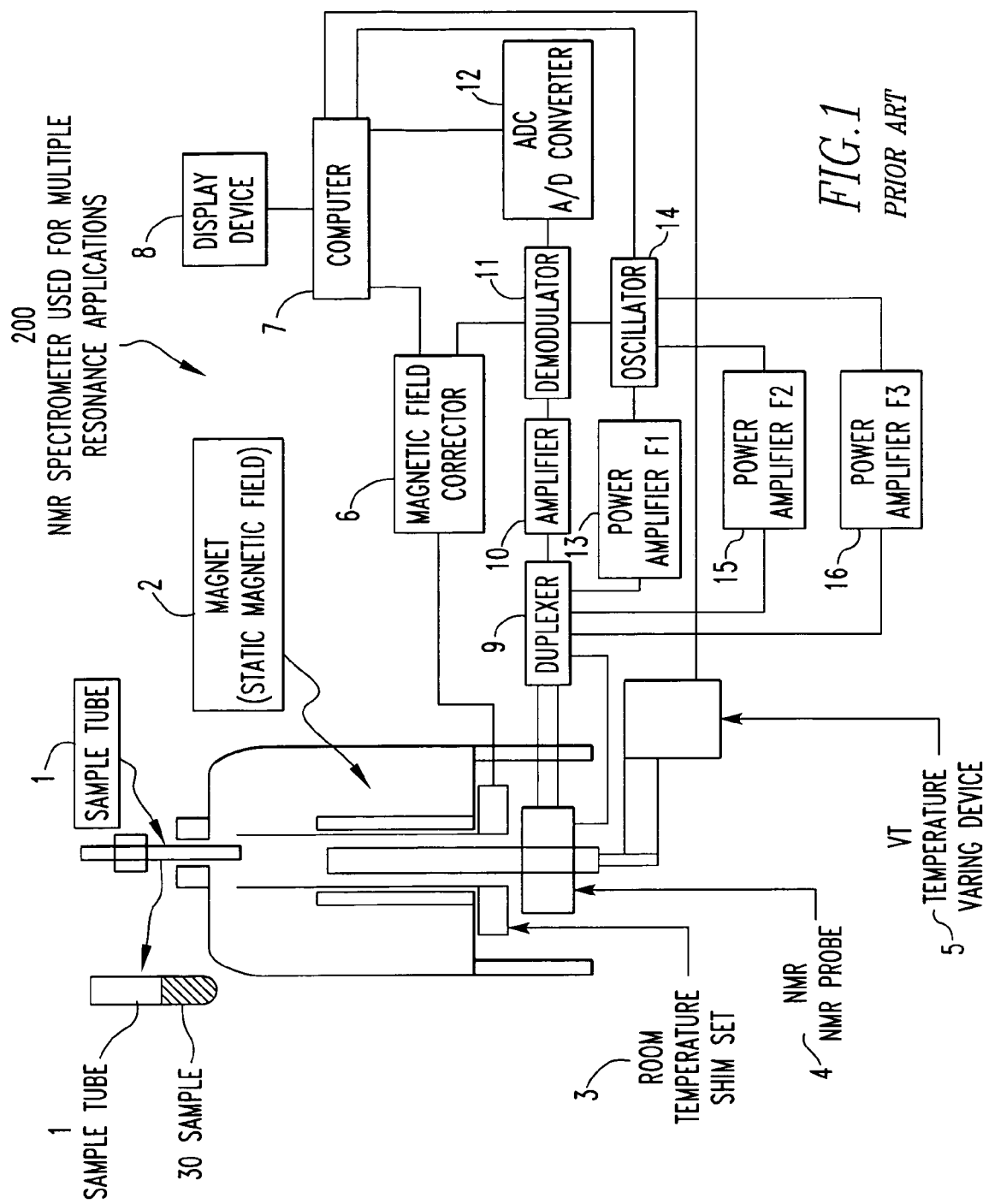
FIG. 1 is a block diagram of a prior-art multiple-resonance NMR spectrometer.
Figure 2:
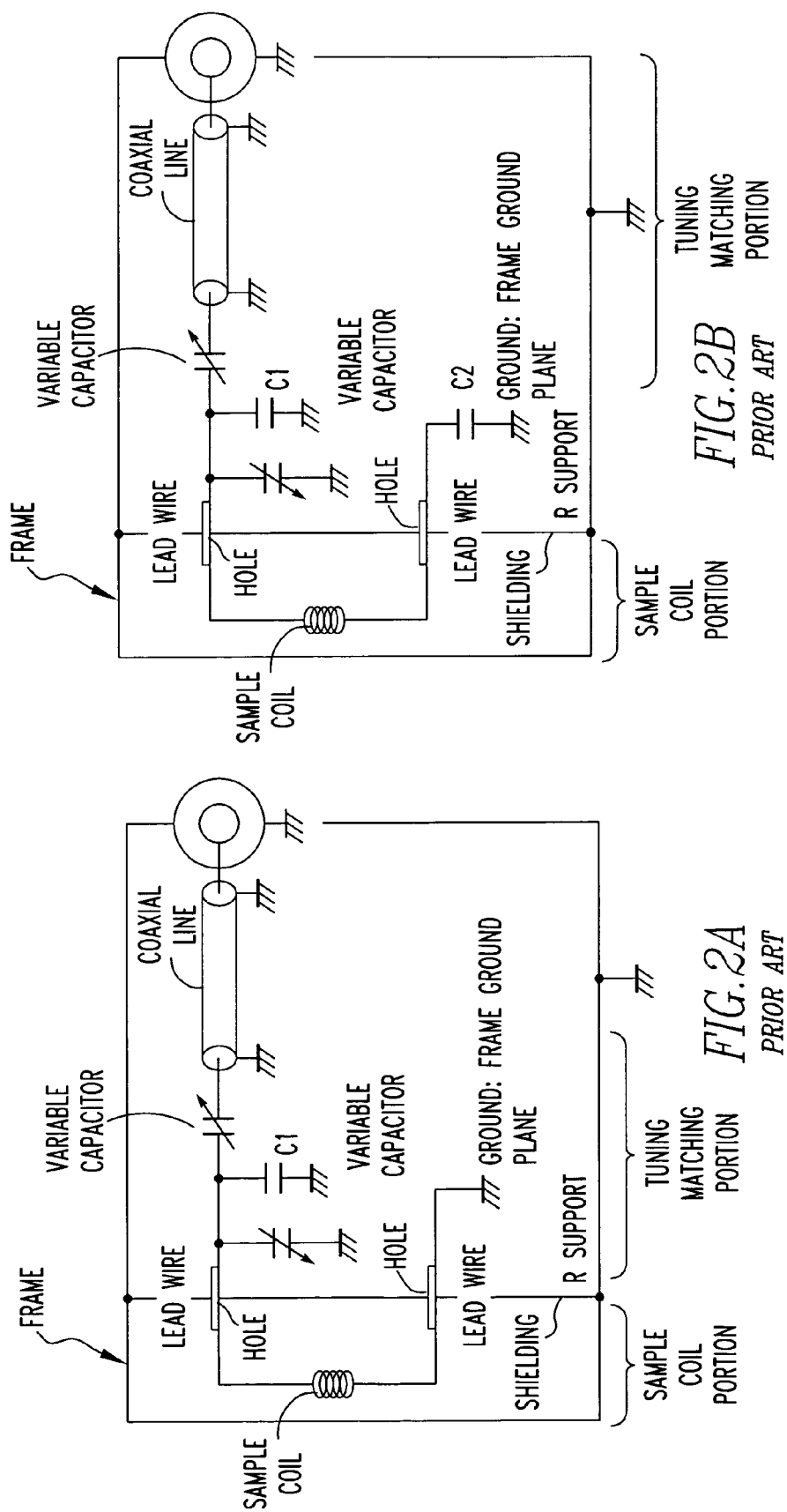
FIGS. 2A and 2B show prior-art resonant circuits.
Figure 5:
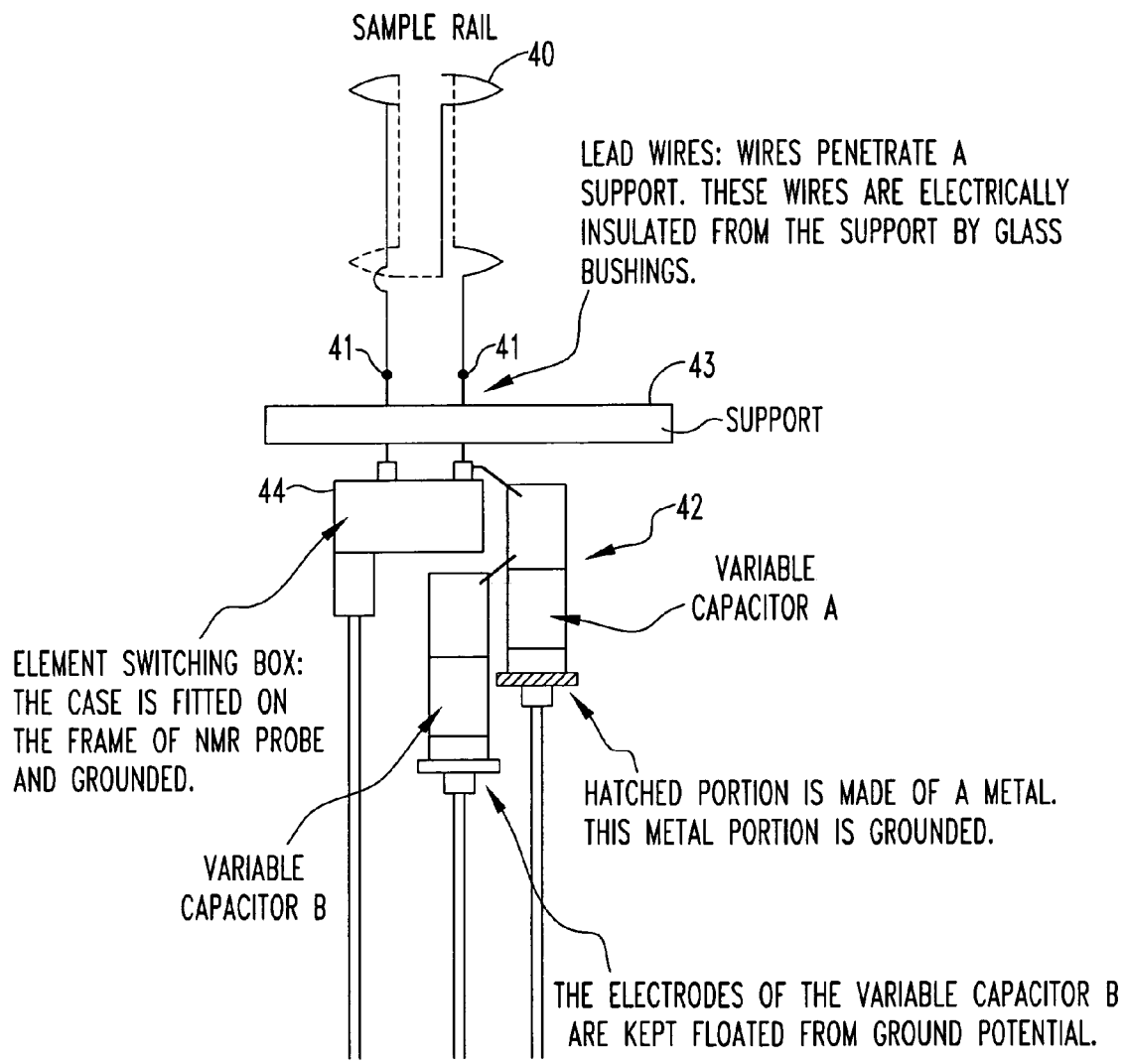
FIG. 5 is a side elevation of a multiple-resonance NMR spectrometer according to one embodiment of the present invention.

FIG. 5 shows an NMR probe according to one embodiment of the present invention. The probe includes a sample coil 40 having two lead wires 41 brought out from the coil 40. The probe further includes a tuning matching portion 42 and a support member 43 made of a conductor. The support member 43 electromagnetically shields the sample coil 40 and the tuning matching portion 42 from each other. The lead wires 41 extend through the support member 43 and are brought out from the coil 40 toward the tuning matching portion 42. The wires 41 are electrically insulated by glass bushings (not shown) to prevent the wires from being shorted to the support member 43.

The two lead wires 41 are brought out into an element-switching box 44 that forms a feature of the present invention to permit elements matched with the tuning frequency of the NMR probe to be selected and connected. The box 44 has a case consisting of a shielding container of a nonmagnetic conductor. The NMR probe further includes a frame (not shown) at ground potential. The case is connected with the frame such that the case is kept at ground potential at all times.

One of the lead wires 41 is connected with variable capacitors A and B. The capacitor A acts as an auxiliary tuning variable capacitive element. The capacitor B acts as a matching variable capacitive element. Thus, tuning and matching between an external transfer path (not shown) and the sample coil 40 are adjusted. One end of the electrodes of the variable capacitor A is grounded. In contrast, the electrodes of the variable capacitor B are kept floated from ground potential.

Figure 6:
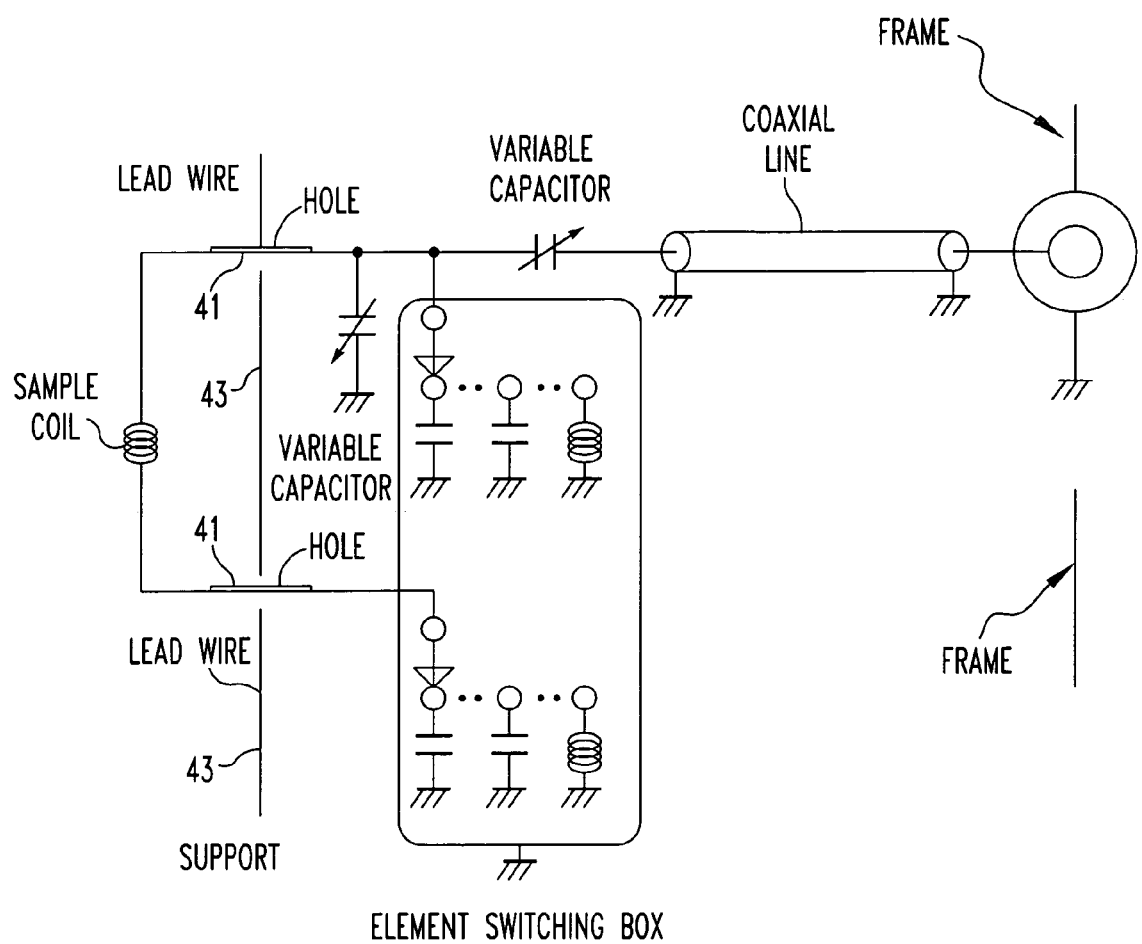
FIG. 6 is a circuit diagram of an element-switching box according to the present invention.

FIG. 6 illustrates the contents of elements contained in the element-switching box 44. The elements include pairs of capacitive elements, shorting terminals, and inductive elements. The switching box 44 switches the connected pair of elements.

Figure 7:
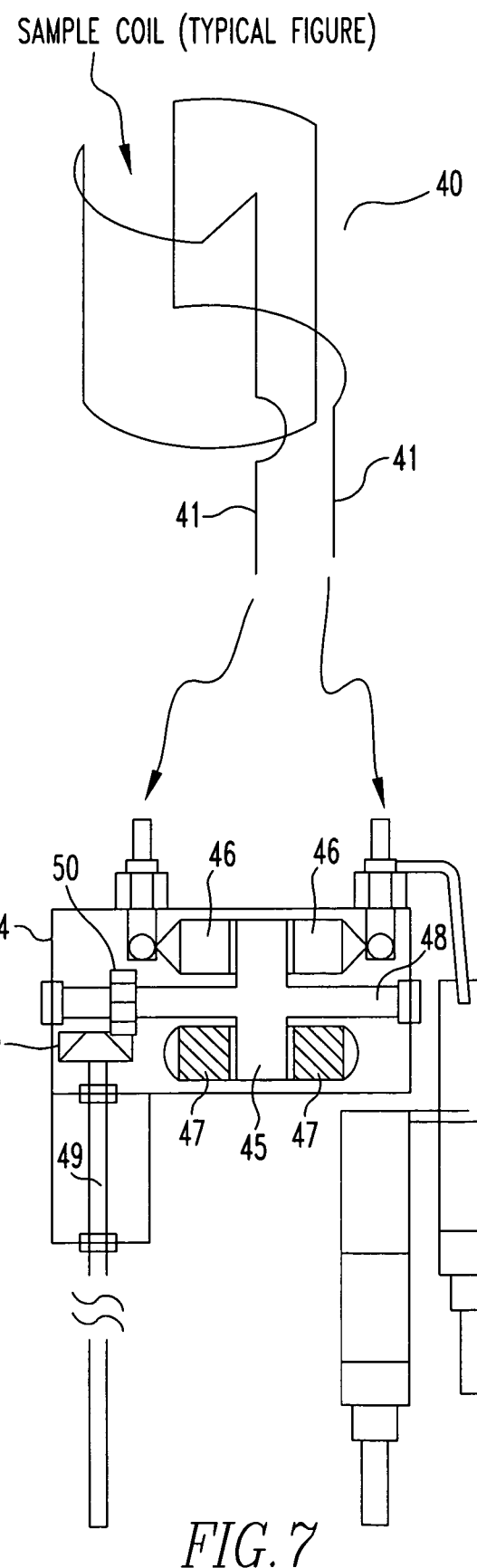
FIG. 7 is a side elevation of the element-switching box shown in FIG. 6.
Figure 8E:
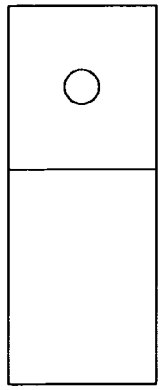
FIGS. 8A to 8E illustrate the element-switching box shown in FIG. 6.
Figure 8A:
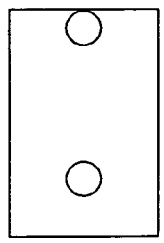
Figure 8B:
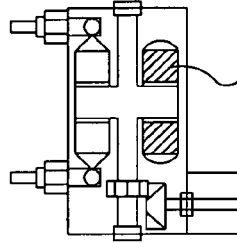
Figure 8D:
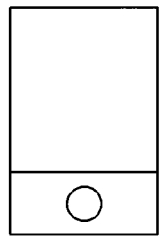
Figure 8C:
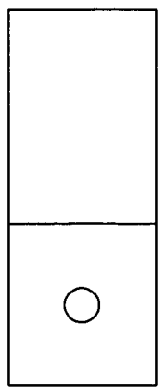

FIG. 7 particularly shows the internal structure of the element-switching box 44. A rotary disk 45 has a substrate made of a nonmagnetic metal, such as phosphor bronze plated with gold or nonmagnetic brass. The substrate is not plated with nickel to prevent the static magnetic field from being disturbed. Chip capacitors 46 or inductors (coils) 47 are arranged in pairs as elements on both faces of the disk 45. The rotary disk 45 has a rotary shaft 48 that is mounted substantially perpendicular to the axis of the static magnetic field applied to the NMR probe to prevent generation of eddy currents on the surface of the rotary disk 45 during rotation; otherwise, the static magnetic field would be disturbed.

FIGS. 8A to 8E particularly show the appearance of the case of the element-switching box 44. The top surface of the case is provided with two small holes to permit the lead wires 41 brought out from the sample coil 40 to be inserted. Each side surface of the case is provided with a hole to permit the rotary shaft 48 of the rotary disk 45 to be supported. The bottom surface of the case is provided with a hole to permit a driver shaft 49 for rotating the rotary disk 45 to be inserted. The driver shaft 49 is appropriately supported by a support means, such as bushings or bearings, mounted in the hole. The case is connected to the frame and at ground potential.

Fundamentally, it is desired that the case be shielded by a conductor in every direction. The wall of the case may be partially omitted according to circumstances, e.g., in a case where it is possible to make sufficient compensation for the effects of electromagnetic radiation by the frame of the body of the NMR probe, in a case where there is no crosstalk between terminals, in a case where no noise enters from other devices, or in a case where the top cover is omitted to offer greater convenience and to reduce the cost.

Figure 9B:
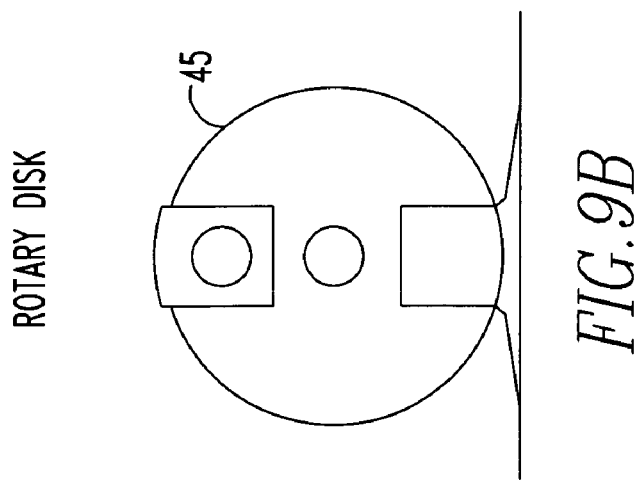
FIGS. 9A and 9B also illustrate the element-switching box shown in FIGS. 8A to 8E.
Figure 9A:
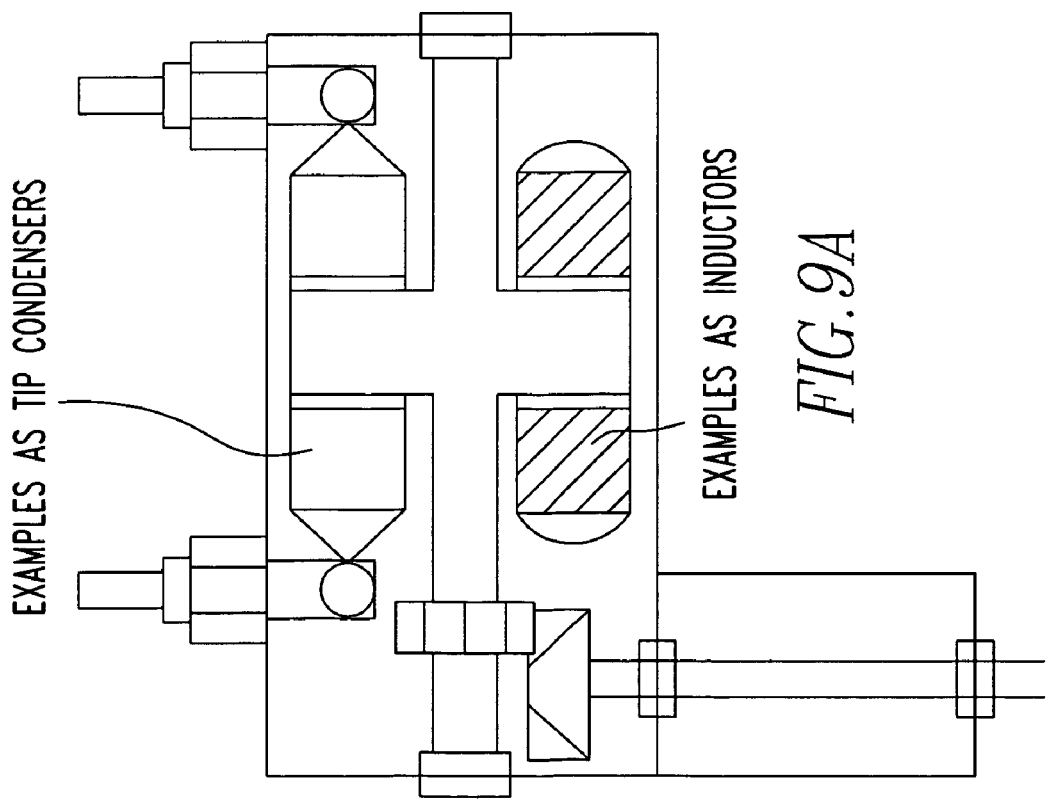

FIGS. 9A and 9B illustrate a method of grounding the rotary disk 45. As described previously, the case of the element-switching box 44 is connected with the frame (not shown) of the NMR probe at ground potential and kept at ground potential at all times. Accordingly, a grounding spring is made of phosphor bronze that is rigid and has resilience. The spring is mounted between the case and the rotary disk 45 to press upon the disk 45 and the grounding spring into abutting engagement with each other at all times. Consequently, the disk and spring are grounded. A grounding spring is made of phosphor bronze that is rigid and has resilience. The spring presses upon the rotating disk.

Figure 10B:
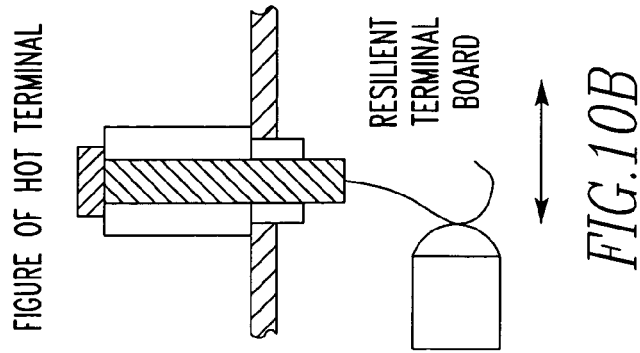
FIGS. 10A and 10B also illustrate the element-switching box shown in FIGS. 8A to 8E.
Figure 10A:
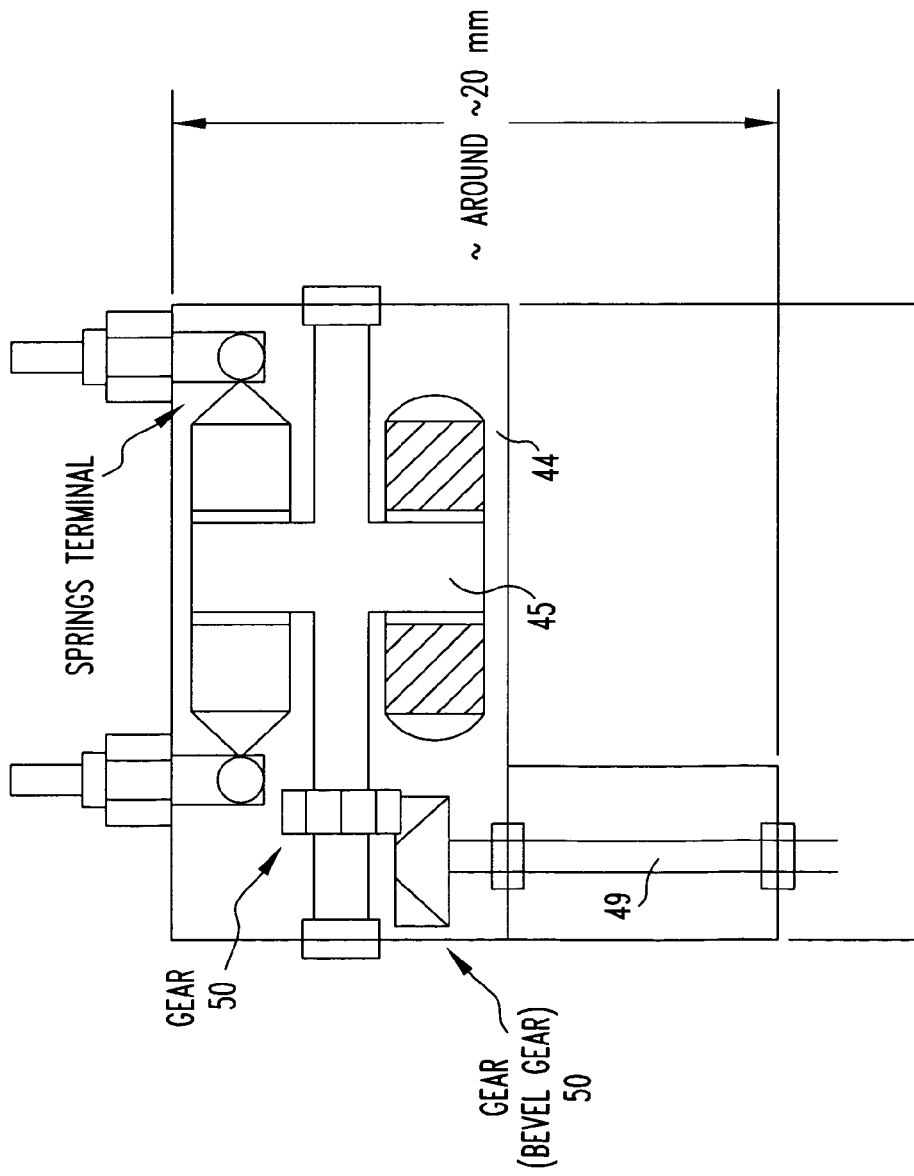

FIGS. 10A and 10B show the contact device of the element-switching box 44. The contact device is designed to be capable of selectively bringing element pairs (tuning elements) on the rotary disk 45 into contact with both ends of the sample coil mounted in the body of the NMR probe or with the lead wires brought out from both ends of the sample coil. The contact terminals of the contact device are made of a resilient terminal board consisting of a nonmagnetic metal, such as phosphor bronze or nonmagnetic brass. The contact terminals are brought into contact with the elements under pressure. The hatched portion is made of a metal. The other portion is made of a resin (such as heat-proof polymer, Diflon™, or Teflon™) or an insulator, such as a ceramic. A bevel gear 50 for transmitting rotation of the driver shaft 49 is made of a hard resin or nonmagnetic brass. With respect to the driver shaft 49, positional reproducibility of each element is obtained by rotating the shaft with an external rotary encoder (not shown). The dimensions of the details of the element-switching box 44 are determined taking account of parasitic inductance, conductor resistance, and contact resistance.

FIG. 11 shows combinations of elements placed on both faces of the rotary disk 45. The elements include four types: capacitive elements, inductive elements (coils), elements having shorting terminals, and elements having no terminals (non-terminal elements). An appropriate combination is selected from the various combinations according to the purpose and disposed on the rotary disk 45. Typically, combinations (a) inductive element-inductive element, (b) non-terminal element-non-terminal element, (c) capacitive element-capacitive element, and (d) capacitive element-element having shorting terminals are often used to cover a wide range of frequencies.

FIGS. 12A and 12B show a modified example of the rotary disk. Instead of a disk, an element placement portion in the form of a cylindrical roller may be used. Where elements are placed over the whole outer surface of the cylinder, the elements are grounded via the axis of rotation of the cylinder. Where elements are placed within a limited area of the cylinder, such as a semicircular portion, the remaining semicircular portion is used to ground the elements.

Figure 13A:
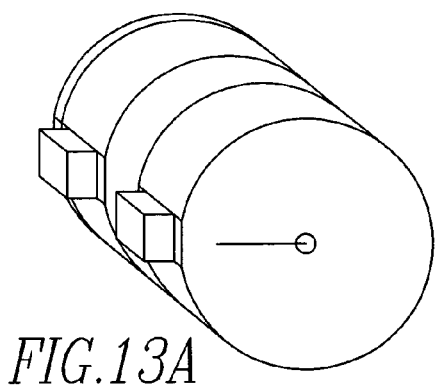
FIGS. 13A, 13B, and 13C show a further element-switching box according to the present invention.
Figure 13B:
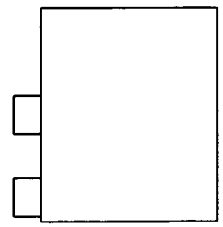
Figure 13C:
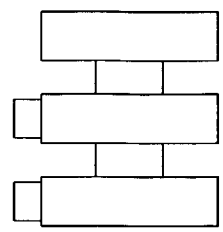

FIGS. 13A, 13B, and 13C show a modified example of the element placement portion in the form of a roller. In this example, elements are placed on the surfaces of convex portions of disks. Consequently, other members, such as variable capacitors, can be positioned in the recessed portions between the disks.

Figure 14A:
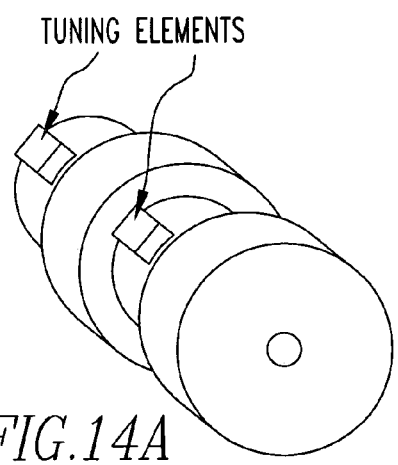
FIGS. 14A and 14B show yet another element-switching box according to the present invention.
Figure 14B:
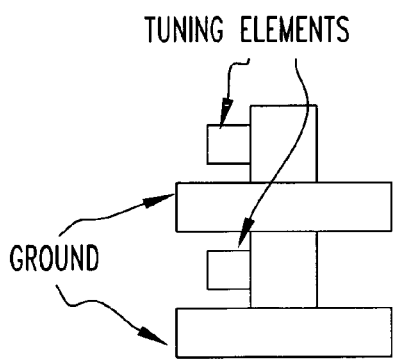

FIGS. 14A and 14B show another modified example of the element placement portion in the form of a roller. In this example, elements are placed on the surfaces of the recessed portions between the disks. In consequence, elements can be placed over the whole periphery of 360°. As a result, more frequency bands can be selected. In this case, grounding is done at the surfaces of convex portions of disks.

Figure 15A:
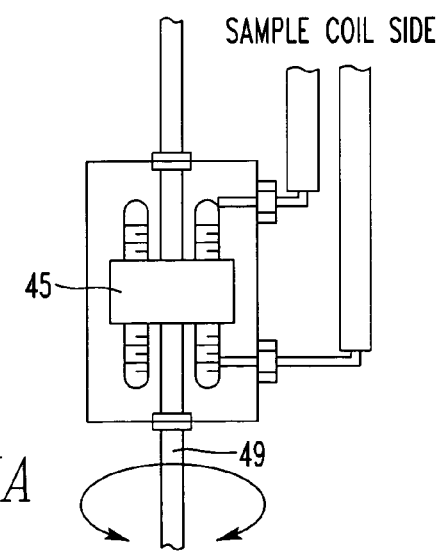
FIGS. 15A and 15B show still another element-switching box according to the present invention.
Figure 15B:
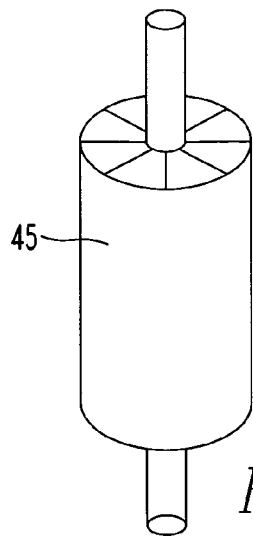

In the embodiment of the present invention described so far, the axis of rotation of the rotary disk is perpendicular to the direction of the static magnetic field applied to the NMR probe. This can be modified as shown in FIGS. 15A and 15B. In particular, where grooves extending in a direction intersecting the peripheral direction are formed in the surface of the disk to hinder generation of eddy currents, if the axis of rotation of the rotary disk slightly faces the direction of the magnetic field, the loop of the eddy currents is cut off. More specifically, if the axis of rotation of the rotary disk is parallel to the direction of the static magnetic field, generation of eddy currents can be suppressed almost fully by forming radial grooves in the disk surface, the grooves extending perpendicular to the peripheral direction. This structure has the advantage that any gear (such as a bevel gear) for bending the direction of rotation through 90° and transmitting the rotation is dispensed with, because the axis of rotation of the driver shaft 49 is coincident with the axis of rotation of the rotary disk 45. As a result, the cost can be reduced greatly. Furthermore, the structural complexity can be lessened greatly.

The advantages of this structure can be enhanced further by holding the NMR lock during rotation of the rotary disk, interrupting shimming operations during this period, and holding old shim information. Deleterious effects of disturbance of the static magnetic field caused by eddy currents produced during rotation of the rotary disk can be almost completely overcome.

In this way, according to the present invention, a mechanism is adopted which permits two terminals to be switched at the same time and which has improved capabilities of grounding elements. Therefore, it is possible to cope with high electric power. Tuning can be made with high Q and over a wide range. This leads to improvement of the performance such as sensitivity improvement.

The element-switching mechanism having a high self-resonant frequency can achieve a circuit configuration involving no spurious signals. Consequently, interference between HF side and LF side is suppressed. It is anticipated that the performance will be improved on the HF side (such as $^1$H and $^{19}$F) as well as on the LF side (such as $^{13}$C, $^{15}$N, and $^{31}$P).

The direction of the axis of rotation of the rotary disk relative to the direction of the static magnetic field is so set that eddy currents are suppressed. Therefore, fluctuation of the magnetic field experienced heretofore when the disk is being driven is reduced. Also, fluctuation of the lock is decreased. Stability of measurements is enhanced. Furthermore, the fluctuation time can be neglected and so no waiting time is necessary. The throughput is improved.

Because the shielding and grounding performance of the case has been improved, generation of electromagnetic noises, electromagnetic radiation, and background signal can be better suppressed.

Elements are placed on both faces of the disk and, therefore, two hot potential locations of each element are spaced from each other spatially widely. Consequently, the discharge withstand voltage is improved.

The present invention can be applied to a wide spectrum of NMR probes.

Having thus described my invention with the detail-and particularity required by the Patent Laws, what is desired protected by Letters Patent is set forth in the following claims.

The invention claimed is:

1. An NMR probe comprising:
a probe body;
a rotary tuner block comprising a rotary body made of a nonmagnetic material and rotatably held in the NMR probe body, there being tuning elements arranged in plural pairs on a surface of the rotary body;
a sample coil mounted in the NMR probe body;

contact means for selectively bringing the pairs of tuning elements into contact with both ends of the sample coil or with lead wires brought out from both ends of the sample coil; and rotationally driving means for rotating the rotary tuner block, wherein the pairs of tuning elements are selectively connected with the sample coil by rotation of the rotary tuner block.

2. An NMR probe as set forth in claim 1, wherein said rotationally driving means for rotating said rotary tuner block is made of a rotary encoder, thus obtaining positional reproducibility of the tuning elements.

3. An NMR probe as set forth in any one of claims 1 and 2, wherein direction of axis of rotation of said rotary tuner block is substantially perpendicular to axis of a static magnetic field applied to the NMR probe.

4. An NMR probe as set forth in any one of claims 1 and 2, wherein direction of axis of rotation of said rotary tuner block has a component in a direction of axis of a static magnetic field applied to the NMR probe.

5. An NMR probe as set forth in claim 4, wherein a surface of said rotary tuner block is provided with grooves extending in a direction intersecting a peripheral direction.

6. An NMR probe as set forth in claim 4, wherein an NMR lock is held stationary during rotation of said rotary tuner block, shimming operations are interrupted during this period, and old shim information can be held.

7. An NMR probe as set forth in any one of claims 1 and 2, wherein said rotary tuner block is accommodated within a shielded conductor case.

8. An NMR probe as set forth in claim 7, wherein said shielded conductor case is kept at ground potential.

9. An NMR probe as set forth in any one of claims 1 and 2, wherein said rotary tuner body is made of a disk-like body, and wherein the plural pairs of tuning elements are arranged on both faces of the disk-like body.

10. An NMR probe as set forth in claim 9, wherein said rotary body forming said rotary tuner block is made either of phosphor bronze plated with gold or of a nonmagnetic metal such as nonmagnetic brass.

11. An NMR probe as set forth in claim 10, wherein said rotary body forming said rotary tuner block has a substrate plated with gold, and wherein said substrate is not plated with a magnetic metal such as nickel.

12. An NMR probe as set forth in claim 9, wherein said plural pairs of tuning elements are made of combinations of four kinds of elements: (i) capacitive element, (ii) inductive element (coil), (iii) shorting element, and (iv) non-terminal element.

13. An NMR probe as set forth in claim 12, wherein the combinations of said plural pairs of tuning elements include any one of capacitive element-capacitive element, non-terminal element-non-terminal element, inductive element-inductive element, capacitive element-shorting element, inductive element-shorting element, non-terminal element-capacitive element, inductive element-capacitive element, and non-terminal element-inductive element.

14. An NMR probe as set forth in claim 9, wherein contact terminals of said tuning elements are a resilient terminal board which is made of phosphor bronze or a nonmagnetic metal such as nonmagnetic brass and which is made to make contact under pressure.

15. An NMR probe as set forth in claim 9, wherein a disk forming said rotary tuner block is kept at ground potential by urging the disk into contact with said shielded conductor case, using a grounding spring made of phosphor bronze.

16. An NMR probe as set forth in any one of claims 1 and 2, wherein said rotary tuner body is made of a cylindrical body, and wherein the plural pairs of tuning elements are arranged on an outer surface of the cylindrical body.

17. An NMR probe as set forth in claim 16, wherein said rotary body forming said rotary tuner block is made either of phosphor bronze plated with gold or of a nonmagnetic metal such as nonmagnetic brass.

\* \* \* \* \*